(12) United States Patent
Zanati et al.

(10) Patent No.: US 11,749,624 B2
(45) Date of Patent: Sep. 5, 2023

(54) SEMICONDUCTOR DEVICE AND METHOD

(71) Applicant: NXP B.V., Eindhoven (NL)

(72) Inventors: Abdellatif Zanati, Hamburg (DE); Michael B. Vincent, San Jose, CA (US)

(73) Assignee: NXP B.V., Eindhoven (NL)

( * ) Notice: Subject to any disclaimer, the term of this patent is extended or adjusted under 35 U.S.C. 154(b) by 283 days.

(21) Appl. No.: 16/935,629

(22) Filed: Jul. 22, 2020

(65) Prior Publication Data

US 2021/0028131 A1 Jan. 28, 2021

(30) Foreign Application Priority Data

Jul. 25, 2019 (EP) ..................................... 19188375

(51) Int. Cl.
*H01Q 1/22* (2006.01)
*H01L 23/66* (2006.01)
*H01L 21/56* (2006.01)
*H01L 23/31* (2006.01)
*H01L 23/498* (2006.01)
(Continued)

(52) U.S. Cl.
CPC .............. *H01L 23/66* (2013.01); *H01L 21/56* (2013.01); *H01L 23/3121* (2013.01); *H01L 23/49861* (2013.01); *H01Q 21/064* (2013.01); H01L 2223/6616 (2013.01); H01L 2223/6677 (2013.01); *H01Q 1/2283* (2013.01); *H01Q 13/02* (2013.01)

(58) Field of Classification Search
CPC ..... H01L 23/66; H01L 21/56; H01L 23/3121; H01L 23/49861; H01L 2223/6616; H01L 2223/6677; H01L 2224/16225; H01L 2924/16151; H01L 2924/16251; H01L 2924/181; H01L 23/16; H01L 23/3142; H01L 23/49534; H01L 23/49575; H01Q 21/064; H01Q 1/2283; H01Q 13/02; H01Q 13/06; H01Q 13/10; H01Q 1/3233; H01Q 1/52; H01Q 1/526; H04B 1/40
See application file for complete search history.

(56) References Cited

U.S. PATENT DOCUMENTS 6,707,138 B2 * 3/2004 Crowley ................. H01L 24/84
257/676
7,141,869 B2 11/2006 Kim et al.
(Continued)

*Primary Examiner* — Jean B Jeanglaude

(57) ABSTRACT

A semiconductor device and a method of making the same. The device includes an encapsulant. The device also includes a semiconductor die in the encapsulant. The device further includes electromagnetic radiation transmitting and receiving parts in the encapsulant. The device also includes an intermediate portion having a first surface and a second surface. The first surface is attached to the encapsulant. The device also includes an antenna portion attached to the second surface of the intermediate portion. The antenna portion includes one or more openings for conveying electromagnetic radiation. The intermediate portion includes one or more corresponding openings aligned with the openings of the antenna portion. Each opening of the antenna portion and each corresponding opening of the intermediate portion forms an electrically contiguous passage for conveying the electromagnetic radiation to the electromagnetic radiation transmitting and receiving parts in the encapsulant.

20 Claims, 7 Drawing Sheets

(51) Int. Cl.
    *H01Q 21/06*     (2006.01)
    *H01Q 13/02*     (2006.01)

(56) References Cited

U.S. PATENT DOCUMENTS

| | | | |
|---|---|---|---|
| 9,583,811 | B2 | 2/2017 | Seler et al. |
| 2002/0074654 | A1 | 6/2002 | Koriyama |
| 2009/0066590 | A1* | 3/2009 | Yamada ............... H01Q 19/062 |
| | | | 343/702 |
| 2012/0068316 | A1* | 3/2012 | Ligander ................ H01P 5/107 |
| | | | 257/664 |
| 2013/0256850 | A1 | 10/2013 | Danny et al. |
| 2014/0268780 | A1* | 9/2014 | Wang .................... H05K 1/028 |
| | | | 362/249.06 |
| 2014/0332975 | A1* | 11/2014 | Raorane ................. H01L 24/19 |
| | | | 438/109 |
| 2019/0057940 | A1* | 2/2019 | Cheah .................... H01L 25/50 |

* cited by examiner

SEMICONDUCTOR DEVICE AND METHOD

CROSS-REFERENCE TO RELATED APPLICATIONS

This application claims the priority under 35 U.S.C. § 119 of European Patent application no. 19188375.0, filed on 25 Jul. 2019, the contents of which are incorporated by reference herein.

BACKGROUND

The present specification relates to a semiconductor device and method.

Nowadays the trend goes to higher integration of mm wave transceivers in small packaged integrated circuits (ICs). Typical applications for such devices include automotive RADAR and 5G communication systems. As an example, RADAR ICs with integrated transmitters and receiver are available for automotive radar applications at 77 GHz. Furthermore, large array antennas are used to realise multiple-input-multiple-output (MIMO) operation. This technique is widely used in modem radar and communication systems.

Mm-wave packaged transceiver ICs are typically soldered on a printed circuit board (PCB). Examples of such devices are shown in FIGS. 1 and 2.

The example device 11 in FIG. 1 includes a semiconductor die 30 located in an encapsulant 20. The device 11 also includes radiation transmitting and receiving parts 24. The radiation transmitting and receiving parts 24 may, for instance, comprise metallic portions located in the encapsulant 20 and electrically connected with the semiconductor die 30 (e.g. see connections 25 in FIG. 1).

The encapsulant 20 is mounted on a substrate 40 such as a printed circuit board (PCB) using solder balls 42. The solder balls 42 provide for mechanical attachment of the encapsulant 20 to the substrate 40, and can also provide electrical connections between the encapsulant 20 containing the die 30 and the substrate 40.

The semiconductor device 11 also includes an antenna portion 2, which in the present example comprises a slot antenna array including a plurality of slots 4. The antenna portion 2 is at least partially metallic. The antenna portion 2 is located on an opposite side of the encapsulant 20 to the substrate 40.

As shown in FIG. 1, the slots 4 form openings which are aligned with the radiation transmitting and receiving parts 24, so that electromagnetic radiation passing along the slots 4 is incident upon the radiation transmitting and receiving parts 24.

The example device 11 in FIG. 2 also includes a semiconductor die 30 located in an encapsulant 20. The device 11 also includes radiation transmitting and receiving parts 24. The radiation transmitting and receiving parts 24 may, for instance, comprise metallic portions located in the encapsulant 20 and electrically connected with the semiconductor die 30 (e.g. see connections 25 in FIG. 2).

Again, the encapsulant 20 is mounted on a substrate 40 such as a printed circuit board (PCB) using solder balls 42. The solder balls 42 provide for mechanical attachment of the encapsulant 20 to the substrate 40, and can also provide electrical connections between the components located in the encapsulant 20 and the substrate 40.

The semiconductor device 11 also includes a antenna portion 2, which in the present example again comprises a slot antenna array including a plurality of slots 4. Again, the antenna portion 2 is at least partially metallic.

As shown in FIG. 1, the slots 4 form openings which are aligned with the radiation transmitting and receiving parts 24. Note that in this example, the antenna portion 2 is mounted on an opposite side of the substrate 40 to the side of the substrate 40 upon which the encapsulant 20 is mounted. The substrate 40 in this example includes openings 44, which are lined with metal 46. The openings 44 are aligned with the slots 4 and the radiation transmitting and receiving parts 24, so that electromagnetic radiation passing along the slots 4 is incident upon the radiation transmitting and receiving parts 24 via the openings.

It will be appreciated that the examples in FIGS. 1 and 2 allow radiation to be transmitted and received from either "above" or "beneath" the encapsulant 20.

In both the examples in FIGS. 1 and 2, an air gap 50 is present between the radiation transmitting and receiving parts 24 of the device and the antenna portion 2 (FIG. 1) or the substrate 40 (FIG. 2). This air gap 50 can lead to discontinuities of the surface currents flowing between the radiation transmitting and receiving parts 24 and the antenna portion 2, causing mismatch, higher insertion losses and radiation, which decreases the isolation between the radiation transmitting and receiving parts 24 in the device 11. In communication and radar systems, high isolation (>30 dB) between the mm-wave channel is generally required.

SUMMARY

Aspects of the present disclosure are set out in the accompanying independent and dependent claims. Combinations of features from the dependent claims may be combined with features of the independent claims as appropriate and not merely as explicitly set out in the claims.

According to an aspect of the present disclosure, there is provided a semiconductor device comprising:

an encapsulant;

a semiconductor die in the encapsulant:

electromagnetic radiation transmitting and receiving parts in the encapsulant:

an intermediate portion having a first surface and a second surface, wherein the first surface is attached to the encapsulant; and an antenna portion attached to the second surface of the intermediate portion, wherein the antenna portion includes one or more openings for conveying electromagnetic radiation, wherein the intermediate portion includes one or more corresponding openings aligned with the openings of the antenna portion, and wherein each opening of the antenna portion and each corresponding opening of the intermediate portion forms an electrically contiguous passage for conveying said electromagnetic radiation to the electromagnetic radiation transmitting and receiving parts in the encapsulant.

According to another aspect of the present disclosure, there is provided a method of making a semiconductor device, the method comprising:

encapsulating a semiconductor die and radiation transmitting and receiving parts in an encapsulant;

providing an intermediate portion having a first surface and a second surface;

attaching the first surface of the intermediate portion to the encapsulant;

providing an antenna portion; and attaching the antenna portion to the second surface of the intermediate portion, wherein the antenna portion includes one or more openings for conveying electromagnetic radiation, wherein the intermediate portion includes one or more corresponding openings aligned with the openings of the antenna portion, and wherein each opening of the antenna portion and each corresponding opening of the intermediate portion forms an electrically contiguous passage for conveying said electromagnetic radiation to the electromagnetic radiation transmitting and receiving parts in the encapsulant.

The provision of an electrically contiguous passage for conveying the electromagnetic radiation from the antenna portion to the electromagnetic radiation transmitting and receiving parts in the encapsulant can avoid the presence of mismatch, insertion losses and radiation associated with the presence of an air gap located between the encapsulant and the antenna portion in a semiconductor device.

The intermediate portion may include a conductive elastomer. This can allow the antenna portion and the encapsulant to be attached together in such a way that the intermediate portion can absorb mechanical stress between the antenna portion and the encapsulant. The use of a conductive elastomer in this way can also improve the tolerances for the flatness of the surfaces of the antenna portion and the encapsulant that face each other. The conductive elastomer may also serve as a heat sink for moving heat from the encapsulant and the components located therein toward the antenna portion. Furthermore, the conductive elastomer can act as a shield to prevent EMC/EMI radiation.

The intermediate portion may include a layer of the conductive elastomer. This can simplify the manufacturing process.

The electromagnetic radiation transmitting and receiving parts may include one or more electrically conductive portions aligned with the opening(s) of the antenna portion and the corresponding opening(s) of the intermediate portion for transmitting and receiving the electromagnetic radiation.

The encapsulant may include one or more openings lined with an electrically conductive material. The or each opening may be aligned with a respective one of the electrically contiguous passages, for conveying the electromagnetic radiation within the encapsulant. Again, this can allow the electromagnetic radiation to be conveyed without experiencing losses associated with gaps in the path that the radiation takes.

Each of the electrically conductive portions for receiving the electromagnetic radiation may be at least partially located with a respective one of the openings in the encapsulant.

The encapsulant may be further attached to a substrate.

The intermediate portion may include a lead frame. This can enable a flip-chip arrangement in the encapsulant.

The intermediate portion may further include a printed circuit board (PCB). The lead frame may be located in between the encapsulant and the printed circuit board. The printed circuit board may be located in between the lead frame and the antenna portion. The lead frame and the printed circuit board may each include one or more openings forming the corresponding openings of the intermediate portion aligned with the one or more openings of the antenna portion.

The encapsulant may include one or more electrical connections for electrically connecting the semiconductor die to corresponding connections on the lead frame.

The opening(s) of the antenna portion and the corresponding opening(s) of the intermediate portion may have substantially the same cross sectional shape and size when viewed along a direction parallel to a surface normal of the first surface of the intermediate portion. Matching the shapes of the various openings can prevent the presence of discontinuities in the path taken by the electromagnetic radiation, thereby to reduce losses. The cross sectional shape may, for instance, be square, oblong, circular or elliptical.

The device may include at least one ring comprising electrically conductive material surrounding the electrically contiguous passage to prevent leakage of the electromagnetic radiation from the electrically contiguous passage. In some embodiments, the ring(s) may be located in a dielectric portion of a lead frame.

BRIEF DESCRIPTION OF THE DRAWINGS

Embodiments of this disclosure will be described hereinafter, by way of example only, with reference to the accompanying drawings in which like reference signs relate to like elements and in which.

DETAILED DESCRIPTION

Embodiments of this disclosure are described in the following with reference to the accompanying drawings.

Figure 3:
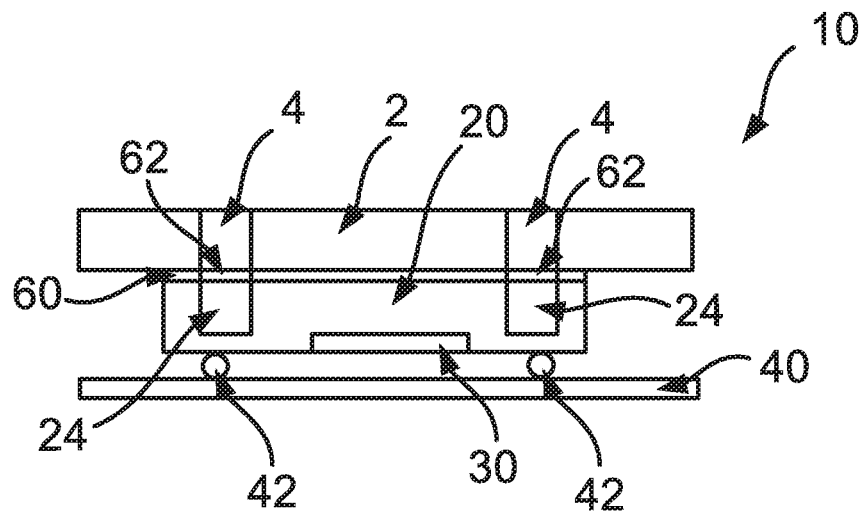
FIG. 3 shows a semiconductor device according to an embodiment of this disclosure.

FIG. 3 shows a semiconductor device 10 according to an embodiment of this disclosure.

The device 10 in FIG. 3 includes a semiconductor die 30 located in an encapsulant 20. The device 10 also includes one or more radiation transmitting and receiving parts 24. The radiation transmitting and receiving parts 24 may, for instance, comprise metallic portions located in the encapsulant 20 and electrically connected with the semiconductor die 30 (these connections are not shown in FIG. 3).

In this embodiment, the encapsulant 20 is mounted on a substrate 40 such as a printed circuit board (PCB) using solder balls 42. The solder balls 42 provide for mechanical attachment of the encapsulant 20 to the substrate 40, and can also provide electrical connections between the components located the encapsulant 20 and the substrate 40. Note that the encapsulant 20 may have pads on its underside (i.e. the side facing the substrate 40) to electrically connect with the solder balls. The semiconductor die 30 may be electrically connected to the pads using a redistribution layer, bond wires, or the like.

The semiconductor device 10 also includes an antenna portion 2, which in the present example comprises a slot antenna array including a plurality of slots 4. The antenna portion 2 is electrically conductive (e.g. at least partially metallic). In this embodiment, the antenna portion 2 is located on an opposite side of the encapsulant 20 to the substrate 40.

As shown in FIG. 3, the slots 4 form openings which are aligned with the radiation transmitting and receiving parts 24, so that electromagnetic radiation passing along the slots 4 is incident upon the radiation transmitting and receiving parts 24.

The semiconductor device 10 also includes an intermediate portion 60. The intermediate portion is located in between the encapsulant 20 and the antenna portion 2. In particular, the intermediate portion 60 has a first surface which is attached to the encapsulant 20 (the "topside" of the encapsulant 20 in this embodiment) and a second surface (which is on an opposite side of the intermediate portion 60) which is attached to the ("underside" of the) antenna portion 2.

The intermediate portion 60 includes one or more openings 62. The openings 62 are aligned with the openings formed by the slots 4 of the antenna portion 2. Note that in this embodiment, the openings 62 are also aligned with the radiation transmitting and receiving parts 24 in the encapsulant 20, whereby the openings formed by the slots 4, the openings 62 and the radiation transmitting and receiving parts 24 are all in alignment. This can allow electromagnetic radiation to be conveyed to/from the radiation transmitting and receiving parts 24 in the encapsulant 20 through the antenna portion 2 and the intermediate portion 60.

Figure 1:
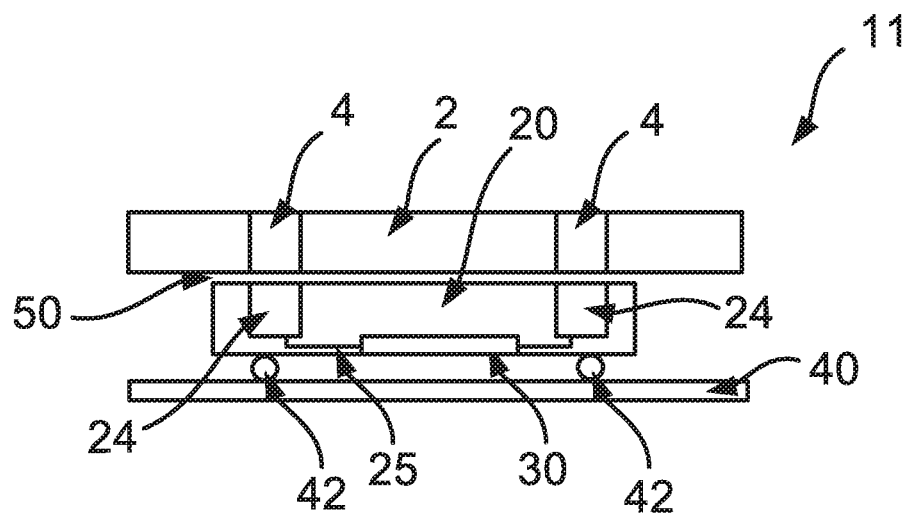
FIG. 1 shows an example of semiconductor device.
Figure 2:
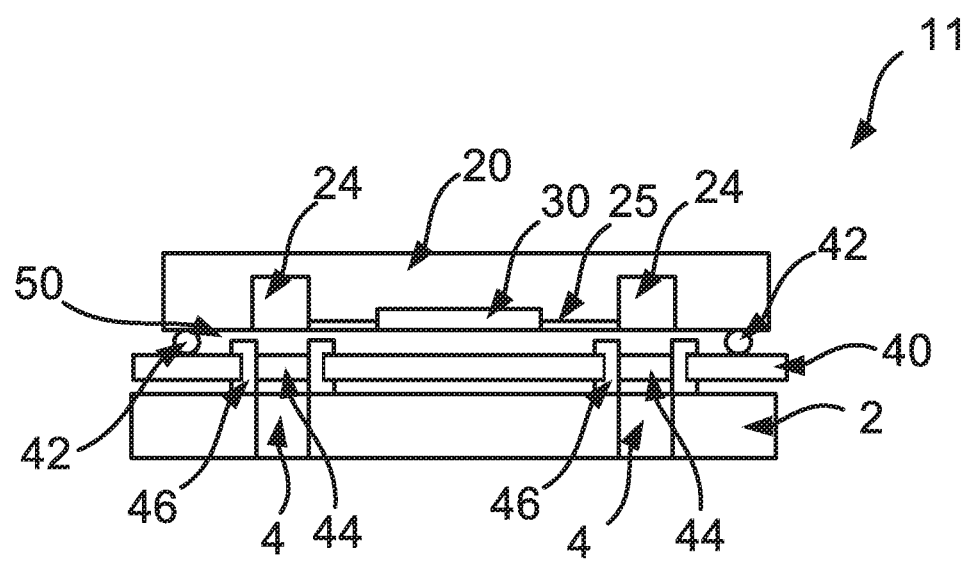
FIG. 2 shows another example of semiconductor device.

As can be seen in FIG. 3, the intermediate portion 60 in this embodiment completely fills the space between the encapsulant 20 and the antenna portion 2. Because of this, there is no air gap located between the encapsulant 20 and the antenna portion 2. Each opening formed by a slot 4 of the antenna portion 2 and each corresponding opening 62 in the intermediate portion may thus form an electrically contiguous passage for conveying the electromagnetic radiation to the radiation transmitting and receiving parts 24 in the encapsulant 20. In this way, the mismatch, insertion losses and radiation associated with the examples shown in FIG. 1 and FIG. 2 can be prevented.

In the present embodiment, the intermediate portion 60 is provided in the form of a layer. The layer may be thinner than the width of the encapsulant 20 and/or the antenna portion 2. The intermediate portion 60 may also perform the function of providing a means of attaching the antenna portion 2 to the encapsulant 20.

It is envisaged that in some embodiments, the intermediate portion 60 may be provided in the form of a ring around the openings (e.g. in the form of a gasket). This can allow less material to be used and can reduce mechanical stresses between the antenna portion 2 and the encapsulant 20.

The intermediate portion in this embodiment comprises an elastomer. The elastomer is conductive, to allow the electrically contiguous passage for the electromagnetic radiation noted above to be implemented. For instance, the conductive elastomer may comprise silicone, flurorosilicone, or polyurethane, filled with conductive particles (the particles may comprise, for example, Ag, Cu, Al, Ni carbon fibre, etc.). The use of a conductive elastomer may also allow the antenna portion 2 to be mounted on the encapsulant 20 in such a way that mechanical stresses between the encapsulant 20 and the antenna portion 2 may be absorbed by the intermediate portion 60.

Figure 4:
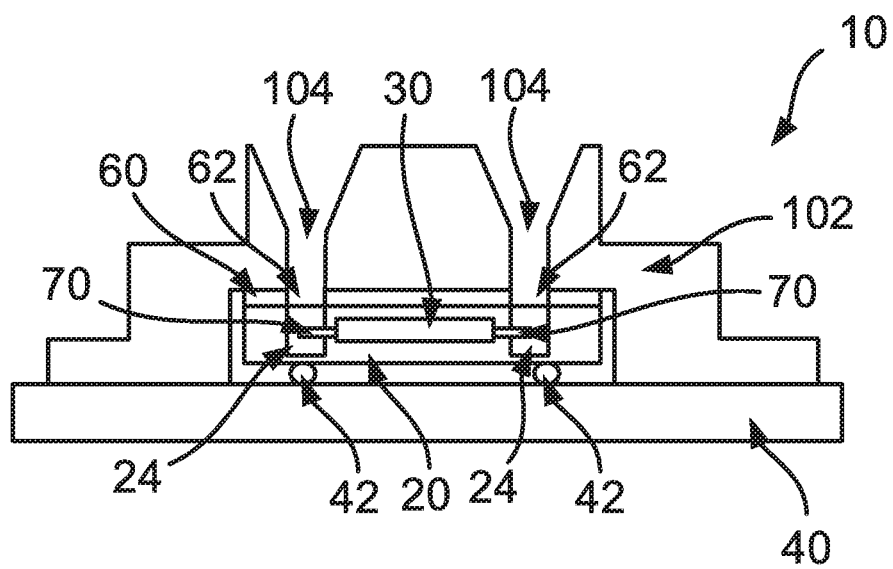
FIG. 4 shows a semiconductor device according to an embodiment of this disclosure.

FIG. 4 shows a semiconductor device 10 according to another embodiment of this disclosure. In some respects, the semiconductor device 10 in this embodiment is similar to the embodiment shown in FIG. 3.

The device 10 in FIG. 4 includes a semiconductor die 30 located in an encapsulant 20. The device includes one or more radiation transmitting and receiving parts 24. The radiation transmitting and receiving parts 24 in this embodiment include openings in the encapsulant 20. The openings may be lined with an electrically conductive material (e.g. a metal or alloy). The radiation transmitting and receiving parts 24 in this embodiment also include an mm wave interface 70 (e.g. dipole or back short). The interface 70 may extend laterally within the encapsulant 20 as shown in FIG. 4. The antenna is electrically connected to the semiconductor die 30. In this way, electromagnetic radiation can be conveyed through the antenna portion 102 and the intermediate portion 60 and provided to the antenna, for transmission and reception of the signal in the semiconductor die 30.

In this embodiment, the encapsulant 20 is mounted on a substrate 40 such as a printed circuit board (PCB) using solder balls 42. The substrate may, for instance, comprise FR4. The solder balls 42 provide for mechanical attachment of the encapsulant 20 to the substrate 40, and can also provide electrical connections between the components inside the encapsulant 20 and the substrate 40. Again, the encapsulant 20 may include pads on its underside (i.e. the side facing the substrate 40) to electrically connect with the solder balls. The semiconductor die 30 may be electrically connected to the pads using a redistribution layer, bond wires, or the like.

The semiconductor device 10 also includes a antenna portion 102, which in the present example comprises three dimensional (3D) antenna. The antenna portion 102 includes openings 104 for conveying electromagnetic radiation to the radiation transmitting and receiving parts 24 in the encapsulant 20. The antenna portion 102 is electrically conductive (e.g. at least partially metallic). In this embodiment, the part of the antenna portion 102 including the openings 104 is located on an opposite side of the radiation transmitting and receiving parts 24 to the substrate 40. The antenna portion 102 may also include peripheral portions that are attached to the substrate 40 for additional mechanical stability.

As shown in FIG. 4, the openings 104 are aligned with the radiation transmitting and receiving parts 24, so that electromagnetic radiation passing along the openings 104 is incident upon the radiation transmitting and receiving parts 24.

Again, the semiconductor device 10 includes an intermediate portion 60, which is located in between the encapsulant 20 and the part of the antenna portion 102 including the openings 104. In particular, the intermediate portion 60 has a first surface which is attached to the encapsulant 20 (the "topside" of the encapsulant 20 in this embodiment) and a second surface (which is on an opposite side of the intermediate portion 60) which is attached to the ("underside" of the) part of the antenna portion 102 including the openings 104.

Again, the intermediate portion 60 includes one or more openings 62. The openings 62 are aligned with the openings 104 of the antenna portion 102. Note that in this embodiment, the openings 62 are again aligned with the radiation transmitting and receiving parts 24 in the encapsulant 20, whereby the openings 104, the openings 62 and the radiation transmitting and receiving parts 24 are all in alignment. This can allow electromagnetic radiation to be conveyed to/from the radiation transmitting and receiving parts 24 in the encapsulant 20 through the antenna portion 102 and the intermediate portion 60.

As can be seen in FIG. 4, the intermediate portion 60 in this embodiment again completely fills the space between the encapsulant 20 and the antenna portion 102. Again, because of this, there is no air gap located between the encapsulant 20 and the antenna portion 102. Each opening 104 and each corresponding opening 62 in the intermediate portion may thus form an electrically contiguous passage for conveying the electromagnetic radiation to the radiation transmitting and receiving parts 24 in the encapsulant 20. In this way, the mismatch, insertion losses and radiation associated with the examples shown in FIG. 1 and FIG. 2 can again be prevented. It is envisaged that the intermediate portion may be in the form of a rings around the openings (e.g. like a gasket) as noted above in relation to the embodiment of FIG. 3.

In the present embodiment, the intermediate portion 60 is again provided in the form of a layer. The layer may be thinner than the width of the encapsulant 20 and/or the antenna portion. The intermediate portion 60 may also perform the function of providing a means of attaching the antenna portion 102 to the encapsulant 20, noting that the antenna portion may also be attached at its periphery to the substrate 40.

The intermediate portion in this embodiment again comprises an elastomer. The elastomer is conductive, to allow the electrically contiguous passage for the electromagnetic radiation noted above to the implemented. The use of an elastomer may also allow the antenna portion 102 to be mounted on the encapsulant 20 in such a way that mechanical stresses between the encapsulant 20 and the antenna portion 102 may be absorbed by the intermediate portion 60.

Figure 5:
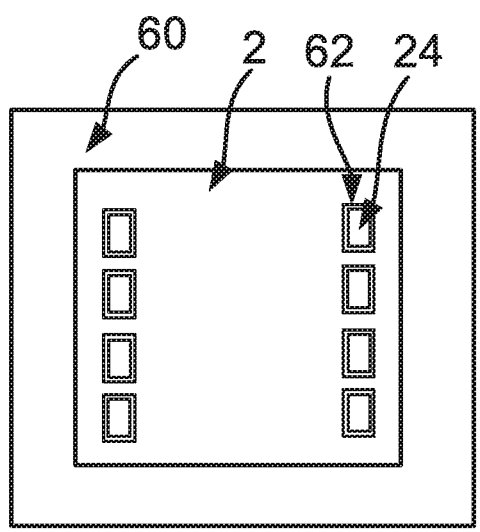
FIG. 5 shows an arrangement of openings in an elastomer layer according to an embodiment of this disclosure.

FIG. 5, which views the semiconductor device 10 along a direction parallel to a surface normal of the abovementioned first surface of the intermediate portion 60, illustrates the alignment of the openings 62 in the intermediate portion 60 with the radiation transmitting and receiving parts 24 in the encapsulant 20 in the embodiments of FIGS. 3 and 4. Note that the radiation transmitting and receiving parts 24 may be of similar or the same size and shape as the openings 62 in the intermediate portion 60. The size and shape of the radiation transmitting and receiving parts 24 and the openings 62 in the intermediate portion 60 may also be matched to the size and shape of the openings 4/104 in the antenna portion 2/102.

Figure 6:
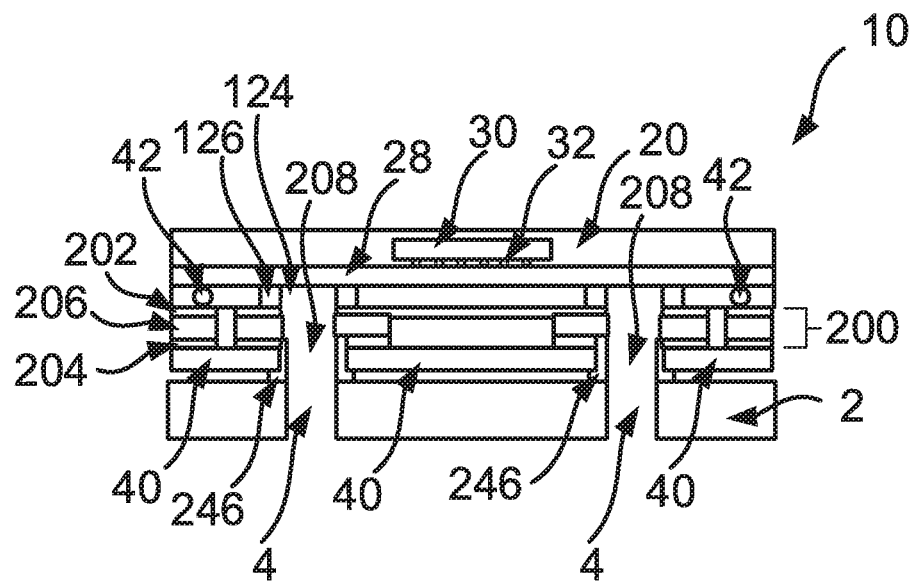
FIG. 6 shows a semiconductor device according to another embodiment of this disclosure.

FIG. 6 shows a semiconductor device 10 according to another embodiment of this disclosure. While in the embodiments of FIGS. 3 to 5, the antenna portion 2/102 is located on an opposite side (the "topside") of the encapsulant 20 to the substrate 40, in the embodiment of FIG. 6, the antenna portion 2 is located on the same side of the encapsulant 20 as the substrate 40. Accordingly, embodiments of this disclosure can allow for mounting of the antenna portion 2/102 on either side (the "topside" or the "underside") of the encapsulant 20.

The device 10 in FIG. 6 includes a semiconductor die 30 located in an encapsulant 20. In this embodiment, the device 10 also includes a ball grid array substrate 28 located in the encapsulant 20. The semiconductor die 30 is mounted on the ball grid array substrate 28 in a flip chip fashion using solder or copper pillar bumps 32.

The device 10 also includes one or more radiation receiving parts, which in this embodiment each include an opening 124 in the encapsulant 20. The opening(s) 124 may be lined with an electrically conductive material 126 (e.g. a metal or alloy). The opening(s) 124 may each terminate at the ball grid array substrate 28, which may be provided with electrically conductive features (e.g. an antenna) for capturing the electromagnetic radiation and passing the associated signal via electrical connections to the semiconductor substrate 30.

The semiconductor device 10 in this embodiment includes a substrate 40 such as a printed circuit board (PCB). The semiconductor device 10 in this embodiment further includes a antenna portion 2, which in the present example comprises a slot antenna array including a plurality of slots. The antenna portion 2 is electrically conductive (e.g. at least partially metallic). As shown in FIG. 6, the slots 4 form openings which are aligned with the openings 124 of the radiation transmitting and receiving parts, so that electromagnetic radiation passing along the slots 4 is incident upon the radiation transmitting and receiving parts.

In this embodiment, the antenna portion 2 is located on an opposite side of the substrate 40 to the encapsulant 20. The substrate 40 is provided with openings to allow electromagnetic radiation from the slots 4 in the antenna portion 2 to pass to the encapsulant 20. The openings in the substrate 40 may be lined with an electrically conductive material 246 (e.g. a metal or alloy). The antenna portion 2 in this embodiment is mounted on a surface (the "underside") of the substrate 40. Note that the lining 246 of the openings in the substrate may extend laterally along the surface (the "underside") of the substrate 40, to prevent an air gap at the interface between the slots 4 and the openings in the substrate 40.

The semiconductor device 10 also includes an intermediate portion. Note that in this embodiment, the intermediate portion includes two parts. The first part of the comprises a lead frame 200. The second part of the intermediate portion comprises the substrate 40. Accordingly, in this embodiment, the intermediate portion is located in between the encapsulant 20 and the antenna portion 2. In particular, the intermediate portion has a surface (the "topside" of the lead frame 200) which is attached to the encapsulant 20 (the "underside" of the encapsulant 20) and a surface (the "underside" of the substrate 40) which is attached to the ("topside" of the) antenna portion 2. As can also be seen in FIG. 6, a surface (the "underside") of the lead frame 200 is attached to a surface (the "topside") of the substrate 40.

The lead frame 200 may include a dielectric layer 206 having metalized surface layers 202, 204 provided thereon. The layers 202, 204 may be patterned to form electrical connections between the substrate 40 and the components in the encapsulant 20. Note that the device 10 may include solder balls 42 or other means for forming electrical connections between the ball grid array substrate 28 and the layer 202 of the lead frame 200.

The intermediate portion includes one or more openings. These openings are formed by the aforementioned openings in the substrate and corresponding openings that are provided in the lead frame 200. The openings in the substrate 40 and corresponding openings in the lead frame 200 are aligned so as to allow electromagnetic radiation to pass through the intermediate portion.

The openings in the intermediate portion are aligned with the openings formed by the slots 4 of the antenna portion 2. Accordingly, in this embodiment, the openings formed by the slots 4 in the antenna portion 2, the openings in the intermediate portion and the radiation transmitting and receiving parts 24 in the encapsulant 20 are all aligned to form passages 208 to allow electromagnetic radiation to be conveyed to/from the radiation transmitting and receiving parts 24 in the encapsulant 20 through the antenna portion 2, the substrate and the intermediate portion 60 and thus transmitted and received by the radiation transmitting and receiving parts 124.

As can be seen in FIG. 6, the intermediate portion 60 in this embodiment fills the space between the encapsulant 20 and the antenna portion 2. Because of this, there is no air gap located between the encapsulant 20 and the antenna portion 2. In particular, each passage 208 is an electrically contiguous passage for conveying the electromagnetic radiation to the radiation transmitting and receiving parts 124 in the encapsulant 20. In this way, the mismatch, insertion losses and radiation associated with the examples shown in FIG. 1 and FIG. 2 can be prevented.

Figure 7:
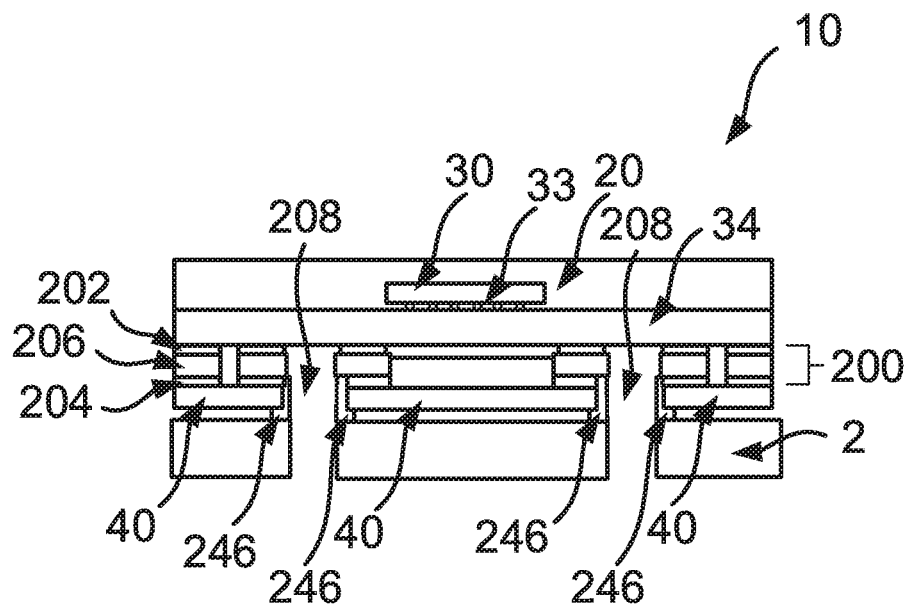
FIG. 7 shows a semiconductor device according to a further embodiment of this disclosure.

FIG. 7 shows a semiconductor device 10 according to a further embodiment of this disclosure. The semiconductor device 10 in FIG. 7 is similar to the semiconductor device 10 of FIG. 6, and only the significant differences will be described here. In particular, in the embodiment of FIG. 7, the device 10 does not include a ball grid array substrate of the kind used in the embodiment of FIG. 6. Instead, the device 10 includes a land grid array substrate 34. The land grid array substrate 34 may be incorporated in the encapsulant 20. This simplifies the device 10 and its electrical connections with the intermediate portion. The semiconductor die 30 is mounted on the ("topside" of the) land grid array substrate 34 in a flip chip fashion using solder or copper pillar bumps 33.

A surface (the "underside") of the land grid array substrate 34 may be attached using solder to the intermediate portion (namely, the "topside" of the lead frame 200). The surface (the "underside") of the land grid array substrate 34 that is attached to the lead frame 200 may be provided with electrically conductive features (e.g. antennae) for transmitting and receiving electromagnetic radiation conveyed through the passages 208. These features may form the radiation transmitting and receiving parts of the device in this embodiment. The transmitted and received signals may be passed from/to the semiconductor die 30 via electrical connections in the land grid array substrate 34 and the land grid array 33.

As can be seen in FIG. 7, the intermediate portion 60 in this embodiment again fills the space between the encapsulant 20 and the antenna portion 2. Because of this, there is no air gap located between the encapsulant 20 and the antenna portion 2. In particular, each passage 208 is an electrically contiguous passage for conveying the electromagnetic radiation to the encapsulant 20. In this way, the mismatch, insertion losses and radiation associated with the examples shown in FIG. 1 and FIG. 2 can be prevented.

Figure 8:
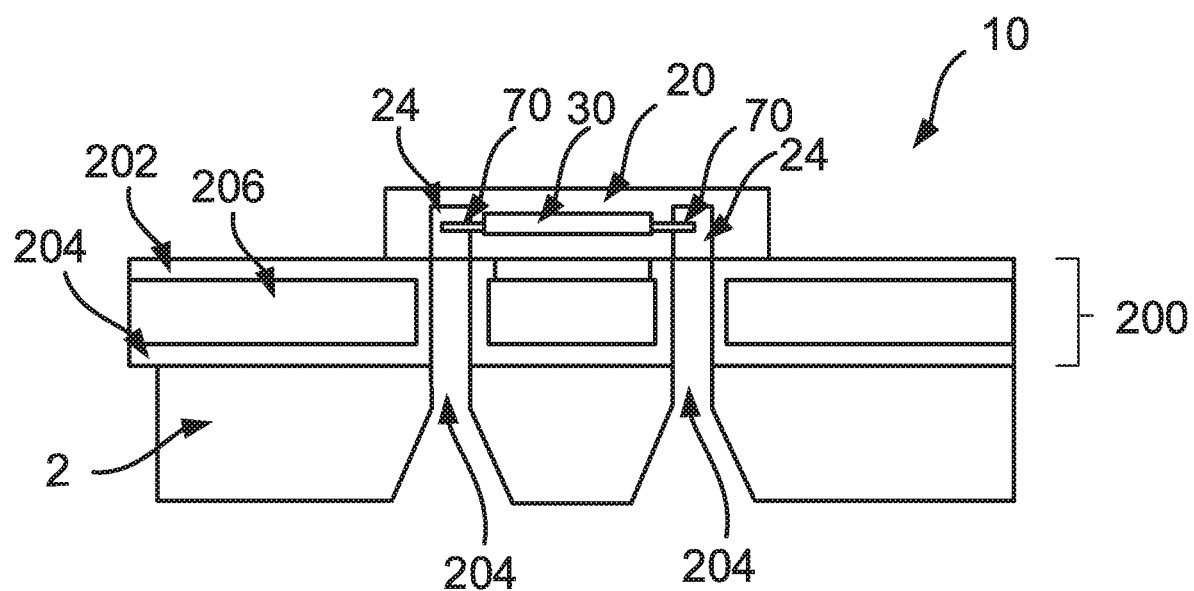
FIG. 8 shows a semiconductor device according to another embodiment of this disclosure.

FIG. 8 shows a semiconductor device 10 according to another embodiment of this disclosure. In this embodiment, the device is similar in some respects to that described above in relation to FIG. 4, and includes a mm wave interface 70 extending laterally within the encapsulant 20 as explained previously. However, in the present embodiment, the encapsulant 20 is mounted on an intermediate portion comprising a lead frame 200 (no separate substrate is provided).

The lead frame 200 itself may be substantially as described above in relation to FIGS. 6 and 7, and may include the aforementioned dielectric layer 206 having metalized surface layers 202, 204 provided thereon. The electrical interconnections between the components in the encapsulant 20 and the lead frame 200 may be implemented in a number of ways in this embodiment. For instance, it is envisaged that wire bonds may be provided between pads on a topside of a redistribution layer in the encapsulant 20 and the lead frame 200.

The semiconductor device 10 in this embodiment includes a antenna portion 2 comprising a three dimensional (3D) antenna. The antenna portion 2 includes openings 204 for conveying electromagnetic radiation to the radiation transmitting and receiving parts in the encapsulant 20. The antenna portion 2 is electrically conductive (e.g. at least partially metallic). In this embodiment, the antenna portion 2 is located on an opposite side of the lead frame 200 to the encapsulant 20. As before, the lead frame 200 includes openings that are aligned with the openings 204 in the antenna portion 2 to allow electromagnetic radiation to be conveyed to the radiation transmitting and receiving parts 24 (e.g. the mm wave interface 70) in the encapsulant 20. The use of the lead frame 200 as an intermediate portion in the present embodiment again allows an electrically contiguous passage, without an air gap, to be formed for conveying the electromagnetic radiation from the antenna portion 2 to the radiation transmitting and receiving parts 24 in the encapsulant 20. In this way, the mismatch, insertion losses and radiation associated with the examples shown in FIG. 1 and FIG. 2 can be prevented.

Figure 9A:
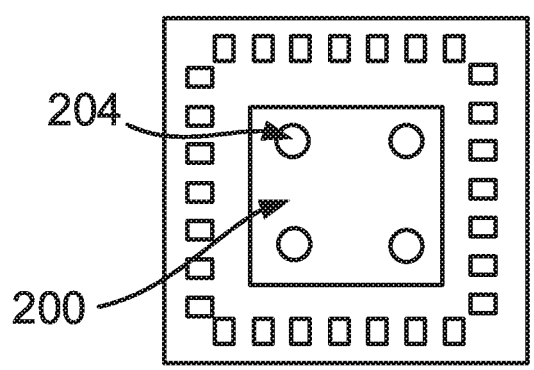
FIGS. 9A to 9D each show an arrangement of openings in a semiconductor device according to further embodiments of this disclosure.
Figure 9B:
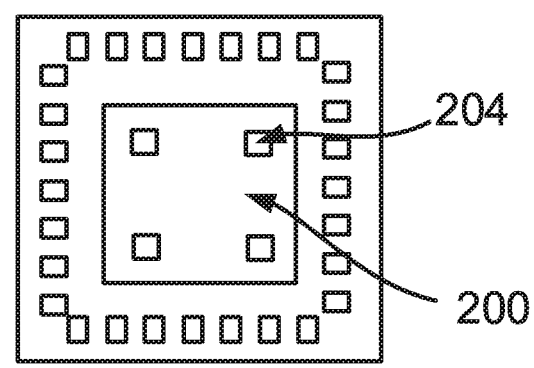
Figure 9C:
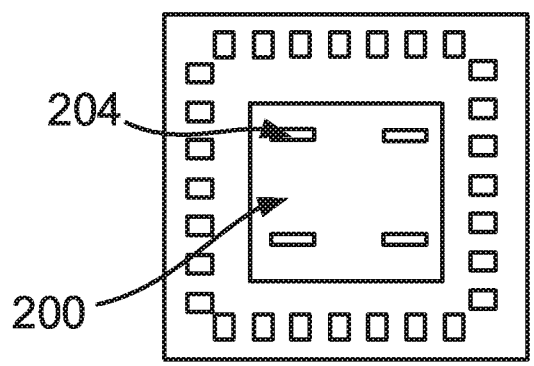
Figure 9D:
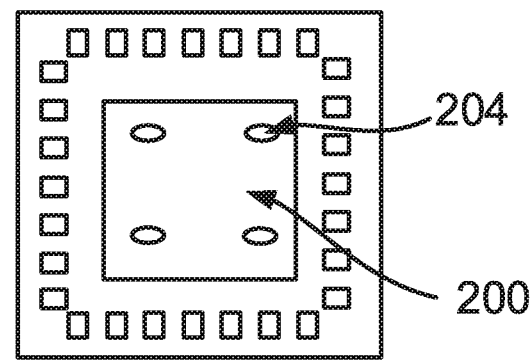
Figure 10:
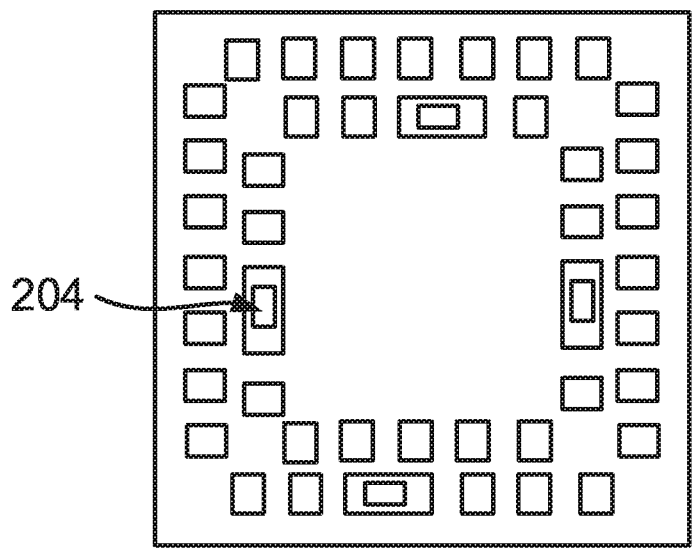
FIG. 10 shows an arrangement of openings in a semiconductor device according to another embodiment of this disclosure.

FIGS. 9A to 9D and FIG. 10 each show an arrangement of openings in a semiconductor device 10 according to embodiments of this disclosure. As can be seen from these figures, the opening(s) of the antenna portion and the corresponding opening(s) of the intermediate portion may have substantially the same cross sectional shape and size when viewed along a direction parallel to a surface normal of a major surface of the intermediate portion. Matching the shapes of the various openings can prevent the presence of discontinuities in the path taken by the electromagnetic radiation, thereby to reduce losses. The cross sectional shape may, for instance, be circular (FIG. 9A), square (FIG. 9B), oblong (FIGS. 9C, and 10), or elliptical (FIG. 9D). Similar considerations apply to each of the embodiments described herein. The openings 204 may in some embodiments be integrated into a ground plane of the lead frame 200 as shown in each of FIGS. 9A to 9D, or may in other embodiments be integrated as a pad as shown in FIG. 10.

Figure 11:
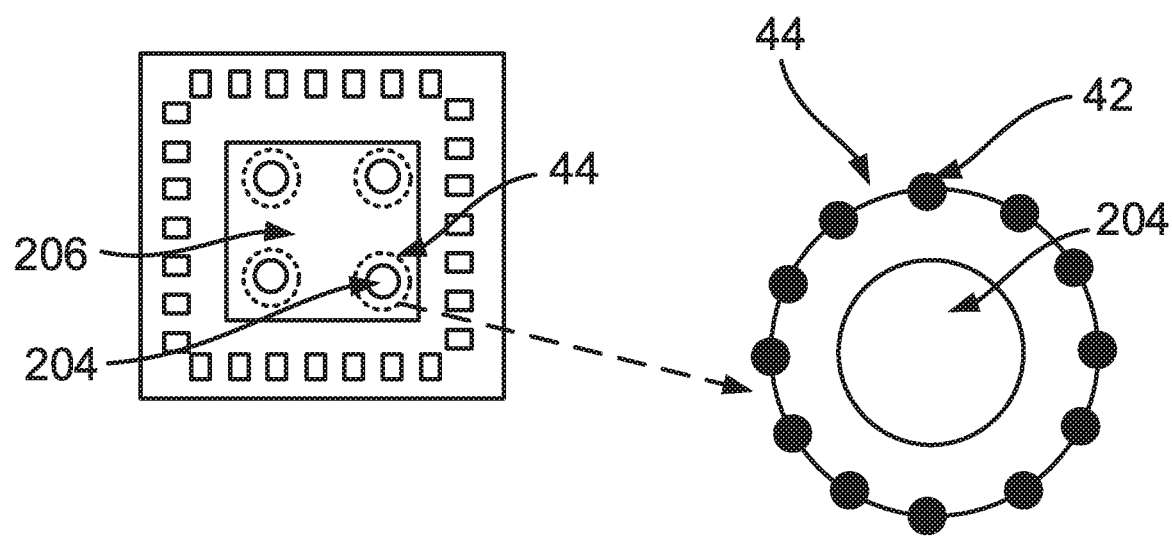
FIG. 11 shows an arrangement solder balls around openings in a semiconductor device according to a further embodiment of this disclosure.

FIG. 11 shows an arrangement of rings 44 around the openings 204 in a semiconductor device 10 according to a further embodiment of this disclosure. Each ring 44 may be located in the dielectric 206 of the lead frame 200 and may extends between the metalized surface layers 202, 204. Each ring may, for instance, comprise a plurality of vias 42 filled with electrically conductive material. The vias may, for example, be plate through holes (PTHs) or may comprise metallic (e.g. Cu) via bars. An example arrangement of vias 42 is shown in the detail on the right hand side of FIG. 11.

The provision of these rings 44 can serve as a further barrier to prevent radiation leakage from the openings 204, thereby preventing the electromagnetic radiation in one opening 204 from reaching another opening 204 in the device (e.g. through the dielectric 206).

Accordingly, there has been described a semiconductor device and a method of making the same. The device includes an encapsulant. The device also includes a semiconductor die in the encapsulant. The device further includes electromagnetic radiation transmitting and receiving parts in the encapsulant. The device also includes an intermediate portion having a first surface and a second surface. The first surface is attached to the encapsulant. The device also includes an antenna portion attached to the second surface of the intermediate portion. The antenna portion includes one or more openings for conveying electromagnetic radiation. The intermediate portion includes one or more corresponding openings aligned with the openings of the antenna portion. Each opening of the antenna portion and each corresponding opening of the intermediate portion forms an electrically contiguous passage for conveying the electromagnetic radiation to the electromagnetic radiation transmitting and receiving parts in the encapsulant.

Although particular embodiments of this disclosure have been described, it will be appreciated that many modifications/additions and/or substitutions may be made within the scope of the claims.

The invention claimed is:

1. A semiconductor device comprising:
   an encapsulant;
   a semiconductor die in the encapsulant;
   electromagnetic radiation transmitting and receiving parts in the encapsulant;
   an intermediate portion having a first surface and a second surface, wherein the first surface is attached to the encapsulant; and
   an antenna portion attached to the second surface of the intermediate portion,
   wherein the antenna portion includes one or more openings for conveying electromagnetic radiation,
   wherein the intermediate portion includes one or more corresponding openings aligned with the openings of the antenna portion, and
   wherein each opening of the antenna portion and each corresponding opening of the intermediate portion forms an electrically contiguous passage for conveying said electromagnetic radiation to the electromagnetic radiation transmitting and receiving parts in the encapsulant.

2. The device of claim 1, wherein the intermediate portion comprises a conductive elastomer.

3. The device of claim 1, wherein the electromagnetic radiation transmitting and receiving parts comprise one or more electrically conductive portions aligned with the one or more openings of the antenna portion and the corresponding opening(s) of the intermediate portion for transmitting and receiving said electromagnetic radiation.

4. The device of claim 1, wherein the encapsulant includes one or more openings lined with an electrically conductive material, wherein each opening of the one or more openings is aligned with a respective one of said electrically contiguous passages, for conveying the electromagnetic radiation within the encapsulant between the electromagnetic radiation transmitting and receiving parts and the antenna portion.

5. The device of claim 4, wherein each of said electrically conductive portions for receiving said electromagnetic radiation is at least partially located with a respective one of said openings in said encapsulant.

6. The device of claim 1, wherein the encapsulant is further attached to a substrate, wherein the substrate is on a first side of the encapsulant opposite to a second side of the encapsulant which is attached to the first surface of the intermediate portion.

7. The device of claim 1, wherein the intermediate portion comprises a lead frame.

8. The device of claim 7, wherein:
   the intermediate portion further comprises a printed circuit board (PCB),
   the lead frame is located in between the encapsulant and the printed circuit board,
   the printed circuit board is located in between the lead frame and the antenna portion, and
   the lead frame and the printed circuit board each include one or more openings forming the corresponding openings of the intermediate portion aligned with the one or more openings of the antenna portion.

9. The device of claim 7, wherein the device includes one or more electrical connections in the encapsulant for electrically connecting the semiconductor die to corresponding connections on the lead frame.

10. The device of claim 1, comprising at least one ring comprising electrically conductive material surrounding said electrically contiguous passage to prevent leakage of said electromagnetic radiation from the electrically contiguous passage.

11. The device of claim 1, wherein the opening(s) of the antenna portion and the corresponding one or more openings of the intermediate portion have substantially the same cross sectional shape and size when viewed along a direction parallel to a surface normal of said first surface of said intermediate portion.

12. The device of claim 11, wherein said cross sectional shape is square, oblong, circular or elliptical.

13. The semiconductor device of claim 1,
    wherein the semiconductor die and the electromagnetic radiation transmitting and receiving parts are at least partially enveloped within the encapsulant, wherein a portion of the encapsulant is between the semiconductor die and the antenna portion, and
    wherein the intermediate portion is directly attached to the encapsulant at the first surface and directly attached to the antenna portion at the second surface.

14. A method of making a semiconductor device, the method comprising:
    encapsulating a semiconductor die and radiation transmitting and receiving parts in an encapsulant;
    providing an intermediate portion having a first surface and a second surface;
    attaching the first surface of the intermediate portion to the encapsulant;
    providing an antenna portion; and
    attaching the antenna portion to the second surface of the intermediate portion,
    wherein the antenna portion includes one or more openings for conveying electromagnetic radiation,
    wherein the intermediate portion includes one or more corresponding openings aligned with the openings of the antenna portion, and
    wherein each opening of the antenna portion and each corresponding opening of the intermediate portion forms an electrically contiguous passage for conveying said electromagnetic radiation to the electromagnetic radiation transmitting and receiving parts in the encapsulant.

15. The method of claim 14, wherein the intermediate portion comprises a conductive elastomer.

16. The method of claim 14, wherein the electromagnetic radiation transmitting and receiving parts comprise one or more electrically conductive portions aligned with the one or more openings of the antenna portion and the corresponding opening(s) of the intermediate portion for transmitting and receiving said electromagnetic radiation.

17. The method of claim 14, wherein the encapsulant includes one or more openings lined with an electrically conductive material, wherein each opening of the one or more openings is aligned with a respective one of said electrically contiguous passages, for conveying the electromagnetic radiation within the encapsulant between the electromagnetic radiation transmitting and receiving parts and the antenna portion.

18. The method of claim 17, wherein each of said electrically conductive portions for receiving said electromagnetic radiation is at least partially located with a respective one of said openings in said encapsulant.

19. The method of claim 14, wherein the encapsulant is further attached to a substrate.

20. The method of claim 14, wherein the intermediate portion comprises a lead frame.

* * * * *